United States Patent [19]

Iwamatsu

[11] 4,356,452
[45] Oct. 26, 1982

[54] CLASS A PUSH-PULL AMPLIFIER WITH BIAS CONTROLLING CIRCUIT

[75] Inventor: Masayuki Iwamatsu, Hamamatsu, Japan

[73] Assignee: Nippon Gakki Seizo Kabushiki Kaisha, Japan

[21] Appl. No.: 181,619

[22] Filed: Aug. 26, 1980

[30] Foreign Application Priority Data

Sep. 6, 1979 [JP] Japan .................................. 54-114663
Sep. 6, 1979 [JP] Japan .................................. 54-114664

[51] Int. Cl.³ ............................................. H03F 3/30
[52] U.S. Cl. ................................... 330/265; 330/267; 330/270; 330/273
[58] Field of Search ............... 330/265, 266, 267, 268, 330/270, 272, 273, 274

[56] References Cited

U.S. PATENT DOCUMENTS

| | | | |
|---|---|---|---|
| 3,995,228 | 11/1976 | Pass | 330/265 |
| 4,215,318 | 7/1980 | Kawanabe | 330/268 |
| 4,306,199 | 12/1981 | Kondou | 330/268 |

Primary Examiner—James B. Mullins
Attorney, Agent, or Firm—Kane, Dalsimer, Kane, Sullivan and Kurucz

[57] ABSTRACT

A class A complementary push-pull amplifier comprising first amplification means and second amplification means complementary in type to the first amplification means; first and second current detection means for detecting each output current of the first and second amplification means, each current detection means being coupled in serial relation with each other between output points of the first and second amplification means and a load of the push-pull amplifier being connected to a junction point of the first and second current detection means; comparator means for comparing a potential difference developed across the first current detection means and/or the second current detection means with a constant voltage to produce a control signal; and bias setting means for feeding bias current to the first and second amplification means in proportion to the control signal thereby to maintain the sum of output currents of the first and second amplification means constant. The amplifier so constructed can enjoy high thermal stability without the introduction of a conventional thermal coupling compensation as well as low distortion. One example of the applications of the amplifier may preferably be embodied in a Balanced Transformer Less amplifier.

13 Claims, 9 Drawing Figures (A)

(B)

CLASS A PUSH-PULL AMPLIFIER WITH BIAS CONTROLLING CIRCUIT

BACKGROUND OF THE INVENTION

1. Field of the Invention

This invention relates generally to class A push-pull amplifiers with high thermal stability and low distortion as well and, more particularly, to bias circuits for controlling bias current to be fed to each amplifier element constituting an output stage of complementary push-pull amplifiers.

2. Description of the Prior Art

A typical arrangement, in the art, of a class A complementary push-pull amplifier is shown in FIG. 1 wherein an input signal to the amplifier is applied at an input terminal 1 and thence the input signal is voltage amplified at a differential amplifier stage comprised of transistors 2 and 3. The output of the differential amplifier is further voltage amplified at a driver stage transistor 4 to drive an output stage comprised of transistors 5, 6, 7, 8, 9 and 10 so that the input signal thus voltage amplified is power amplified at the output stage to deliver the amplified input signal to an output terminal 14. It is noted that in the amplifier there is provided a bias circuit comprising a resistor 11 and a resistor 12 each connected in series between the base electrodes of the transistors 5 and 8, and a transistor 13 whose base is connected to a junction point of the resistor 11 and the resistor 12, the collector of the transistor 13 being connected to the base electrode of the transistor 5 and the emitter thereof being connected to the base electrode of the transistor 8, respectively. Thus, when the characteristics of the transistors 5, 6, 7, 8, 9 and 10 are varied with ambient temperatures, the transistor 13 which is thermally coupled to the transistors 5, 6, 7, 8, 9 and 10 function to compensate for the alterations in the bias current arising from changes in ambient temperature.

The thermal coupling between the transistors 5, 6, 7, 8, 9 and 10, and the transistor 13 on a single heat sink or the like, however, can not mate the temperature changes at the emitter-base junctions of the transistors 5, 6, 7, 8, 9, 10 and 13 precisely same, and therefore it is practically difficult to obtain the same temperature characteristics between the transistors in order to stabilize thermally. There is another disadvantage accompanying to thus constructed class A complementary push-pull amplifier that harmonic distortion is generated due to an insufficient linearity resulting from the unavoidable asymmetry of the transistors 5, 6, 7, 8, 9 and 10 whose Vbc-Ic characteristics are shown as a exponential function. Further, the exponential function characteristics of the transistors inherently imparts a certain harmonic distortion to the current flowing the output transistors 5, 6, 7, 8, 9 and 10 so that a load current delivered to the output terminal 14 is not similar in waveform to the current flowing each output transistors 5, 6, 7, 8, 9 and 10, for example, while there appears a sinewave load current at the output terminal 14, currents having harmonic distortion therein could flow through the output transistors 5, 6, 7, 8, 9 and 10. Therefore, there is also a disadvantage that a frequency bandwith wider than an input frequency bandwidth is required to a power supply of the amplifier, and this is especially the case when a Balanced Transformer Less amplifier constructed by two conventional class A complementary push-pull amplifiers is used.

SUMMARY OF THE INVENTION

It is, therefore, a principal object of the present invention to provide a class A push-pull amplifier with thermal compensation therefor without the introduction of a conventional thermal coupling between output stage transistors and compensating devices associated therewith.

It is a further object of the invention to provide a class A push-pull amplifier capable of delivering a load current similar in waveform to output currents flowing through output stage transistors of the amplifier.

It is a still further object of the invention to provide a class A push-pull amplifier in which odd harmonic distortion arising from the inherent characteristics of the output stage transistors is substantially suppressed.

In brief, a class A push-pull amplifier according to the invention is constructed in such a way as a bias current of each output stage transistor of the amplifier is controlled so as to maintain constant the sum of each output current flowing through the output stage transistors.

More in particular, according to the present invention there is provided a class A push-pull amplifier comprising a first input terminal and a second input terminal to which an input signal to be amplified is applied in same phase; an output terminal for delivering the input signal amplified to a load; first amplification means and second amplification means for push-pull operation, each amplification means having an input point and an output point and including at least one transistor, the input point of the first amplification means being connected to the first input terminal and the input point of the second amplification means being connected to the second input terminal; first current detection means and second current detection means for detecting respectively each value of output currents delivered from the output points of the first and second amplification means, each current detection means being connected in serial relation with each other between the output points of the first and second amplification means, a junction point of the first and second current detection means being connected to the output terminal; means for detecting a potential difference developed between the first and second current detection means to produce a control signal; and bias setting means for feeding bias currents to the input points of the first and second amplification means in response to the control signal, whereby the sum of each output current delivered from the output points of the first and second amplification means is held constant.

The foregoing and other objects, features and advantages of the invention will be apparent from the following, more detailed, description of a preferred embodiment taken in conjunction with the accompanying drawings, in which:

DETAILED DESCRIPTION

The invention will now be described in more detail in conjunction with the accompanying drawings.

Figure 2:
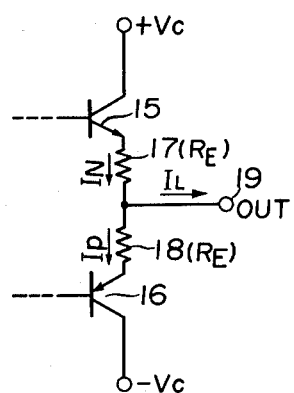
FIG. 2 is a schematic diagram of an output stage of a class A complementary push-pull amplifier showing only a main part thereof.
Figure 3:
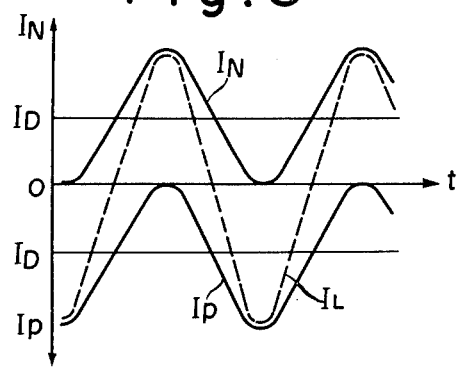
FIG. 3 illustrates a waveform of each current $I_N$, $I_P$ and $I_L$, flowing through the corresponding elements in FIG. 2.

First, referring now specifically to FIGS. 2 and 3, the principles upon which the present invention bases will be described. FIG. 2 is a schematic diagram of an output stage of a conventional class A complementary push-pull amplifier, wherein output transistors of the amplifier are designated as 15 and 16 respectively. The transistors 15 and 16 of a different type, i.e., NPN and PNP type are connected each other in complementary push-pull configuration through respective emitter resistor 17, 18 having a resistance value Re, a junction point of which is connected to an output terminal 19. If it is assumed that the sum of the emitter currents of the transistors 15 and 16 could be held constant during its operation by a certain appropriate means, the following mathematical equation is established:

$$I_N + I_P 2I_D = \text{constant} \quad (1)$$

$$I_N - I_P = I_L \quad (2)$$

where: $I_N$ and $I_P$ represent an emitter current of the transistors 15 and 16, respectively $I_L$ represents an output current appearing at the output terminal 19, and $I_D$ represents a constant idle current flowing through the transistors 15 and 16. From the above two equations, the following two equations are derived:

$$I_N = I_L/2 + I_D \quad (3)$$

$$I_P = I_L/2 + I_D \quad (4)$$

These two equations (3) and (4) manifest themselves that each of emitter currents $I_N$ and $I_P$ of the transistors 15 and 16 may vary with the output current $I_L$ thus having the similar waveform to that of the output current $I_L$, on condition that the sum of the emitter currents $(I_N + I_P)$ is held constant at a value of $2I_D$ by a certain appropriate means. In an attempt to maintain a value of $2I_D$ constant, the following two methods are proposed in accordance with the present invention, i.e., either (a) to compare the total sum of each potential difference delivered across each emitter resistor $(I_N R_E + I_P R_E)$ with a predetermined constant voltage, and hence a control signal obtained by way of above comparison being utilized to feed a bias current to the bases of the transistors 15 and 16 so that the emitter currents $I_N$ and $I_p$ is controlled so as to maintain the total sum $(I_N R_E + I_P R_E)$ constant, or (b) to compare each potential difference developed across each emitter resistor $I_N R_E$ and $I_P R_E$ with predetermined constant voltages independently, and hence control signals obtained by way of above comparison being utilized to feed a bias current to each base of the transistors 15 and 16 so that each of emitter current $I_N$ and $I_P$ is controlled independently so as to maintain the total sum $(I_N R_E + I_P R_E)$ constant.

The above two principles (a) and (b) are further discussed in conjunction with preferred embodiments constructed in accordance with the present invention.

Figure 4:
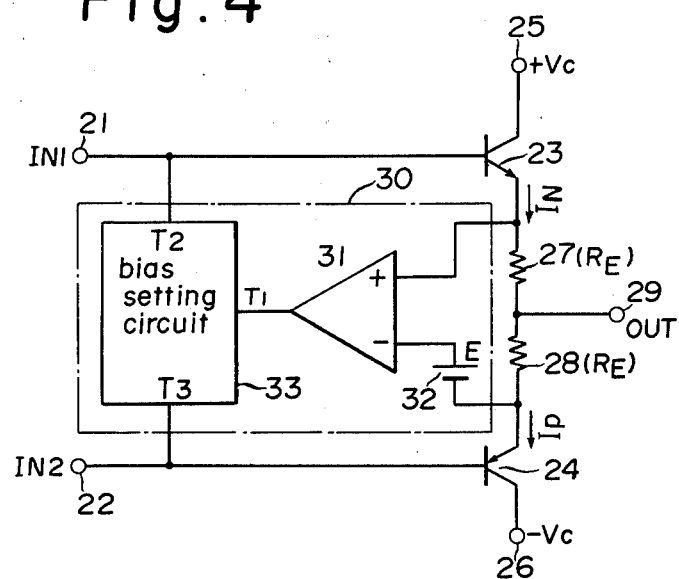
FIG. 4 is a schematic diagram depicted briefly for purposes of illustrating a principle of a first embodiment of a class A complementary push-pull amplifier according to the present invention.

Referring to FIG. 4, there is shown a block diagram of a class A complementary push-pull amplifier constructed in accordance with the principle (a) of the invention. In the drawing, input terminals 21 and 22 are shown connected respectively to the bases of transistors 23 and 24. The transistors 23 and 24, which act as amplification elements for an input signal of the amplifier, are connected each other in common collector configuration, each having of a complementary type NPN and PNP, respectively. The collectors of the transistors 23 and 24 are connected to respective positive and negative power supply terminals 25 and 26, the emitters of which are connected to an output terminal 29 through each emitter resistor 27 and 28 having a resistance value of $R_E$. In addition to the amplifier thus constructed there is provided for controlling bias currents of the transistors 23 and 24 a bias controlling circuit 30 which is comprised of a comparator 31, a constant voltage generator 32 and a bias setting circuit 33. The comparator 31 having a non-inverting input terminal, inverting input terminal and an output terminal is connected at its non-inverting terminal to the emitter of the transistor 23, at its inverting terminal to the positive terminal of the constant voltage generator 32, and at its output terminal to an input terminal $T_1$ of the bias setting circuit 33. The negative terminal of the constant voltage generator 32 is in turn connected to the emitter of the transistor 24. Output terminals $T_2$ and $T_3$ of the bias setting circuit 33 are connected to the respective bases of the transistors 23 and 24.

In the class A complementary push-pull amplifier so constructed, it may be assumed for the purpose of discussion that each potential of the output terminals $T_2$ and $T_3$ of the bias setting circuit 33 is so determined to feed an idle current $I_D$ to each emitter of the transistors 23 and 24 during its quiescent operation, and that an output voltage of the constant voltage generator 32 is so determined to have a value of:

$$E = 2I_D R_E \quad (5)$$

Thus, during dynamic operation when input signals in same phase are applied to the respective input terminals 21 and 22, if the amplifier is forced into the operating condition of $I_N + I_P > 2I_D$, i.e., $I_N R_E + I_P R_E > E$ due to such as distortion caused in the emitter currents $I_N$ and $I_P$ of the transistors 23 and 24, the original balanced condition is restored in the following manner: the potential to be developed at the output terminal of the comparator 31 is shifted toward a positive level with a result that the potential at the output terminal $T_2$ of the bias setting circuit 33 is lowered, while the one at the output terminal T3 of the bias setting circuit 33 is raised by the same amount as the potential at the output terminal T2, thereby decreasing both the emitter currents of the transistors 23 and 24 to retain the initial condition $I_N R_E + I_P R_E + E$, i.e., $I_N + I_P + 2I_D$.

Contrary to the foregoing description, if the amplifier is forced into the operating condition of $I_N R_E + I_P R_E < E$, the emitter currents $I_N$ and $I_P$ are controlled in a same manner as above to increase their potential values by the same amount each other, thereby retaining the initial condition $I_N R_E + I_P R_E = E$, i.e., $I_N + I_P = 2I_D$.

As described above the class A complementary push-pull amplifier shown in FIG. 4 is so constructed that the total sum of each emitter current $(I_N + I_P)$ of the transistors 23 and 24 is always maintained constant by employing the bias controlling circuit 30. As a result, the waveform of each emitter current of the transistors 23 and 24 is similar in shape to that of an output current fed to a load through the output terminal 29, which is understood from the equations (3) and (4) above. Moreover, even if the characteristics of the transistors 23 and 24 are varied with ambient temperatures and the resulting alterations of the emitter currents $I_N$ and $I_P$ are being generated, since the compensation for the emitter current alterations is performed to make them constant in the above described manner, there is no need for a conventional thermal compensating means such as being thermally coupled with a heat sink.

An example of a more concrete embodiment of a class A complementary push-pull amplifier according to the principle (a) of the invention is now described with reference to FIG. 5 wherein identical reference numerals have been used to designate corresponding parts of FIG. 4.

Figure 5:
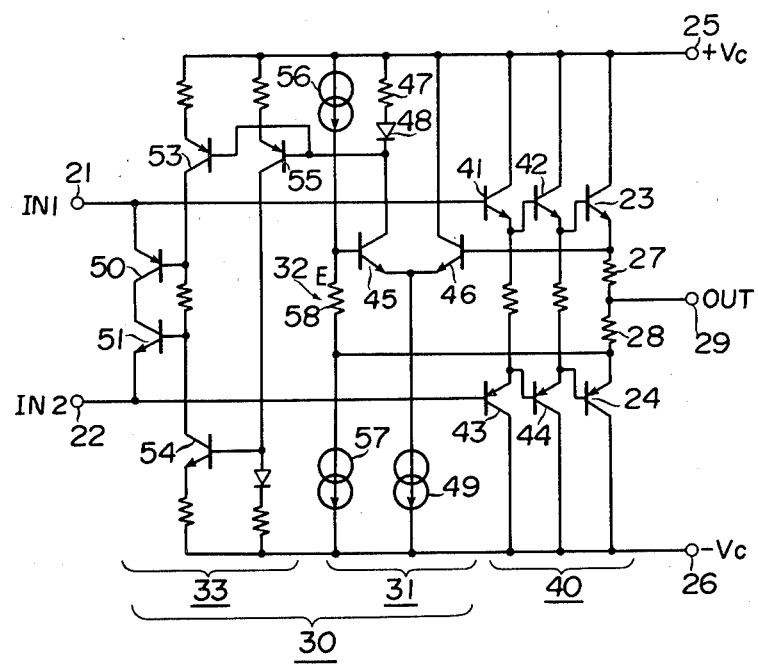
FIG. 5 is a more concrete schematic diagram of the first embodiment of a class A complementary push-pull amplifier according to the invention.

The class A complementary push-pull amplifier shown in FIG. 5 is comprised of an amplification section 40, a comparator 31 and a bias setting circuit 33. The amplification section 40 is comprised of two complementary output transistors 23 and 24 for push-pull operation with transistors 41 and 42 for driving the output transistor 23 and with transistors 43 and 44 for driving the output transistor 24. The bases of the transistors 41 and 43 are connected to respective input terminals 21 and 22 to which input signals in same phase are applied, while the emitters of the output transistors 23 and 24 are connected to an output terminal 29 through respective emitter resistors 27 and 28. The comparator 31 is a differential amplifier made of two transistors 45 and 46 the bases of which are respectively connected to the emitter of the output transistor 23 and to the emitter of the output transistor 24 through a constant voltage generator 32 generating a constant voltage E and comprising constant current sources 56 and 57 and a resistor 58, so that the potential difference between the constant voltage E supplied from the constant voltage generator 32 and the potential developed across the resistor 27 and 28 is voltage amplified to output a control signal at the collector of the transistor 45 whose load is composed of a resistor 47 and a diode 48 connected together in series to a positive power supply terminal 25. The emitters of the transistors 45 and 46 are also connected to a negative power supply terminal 26 through a current source 49. The control signal supplied from the collector of the transistor 45 is further fed to the bias setting circuit 33 which comprises transistors 50 and 51 by operations of which the transistors 41 and 43 are driven in opposite phase with each other, transistors 53 and 54 operatively connected to respective transistors 50 and 51 to control the base currents thereof, and a transistor 55 for driving the transistor 54 by the control signal oppositely in relation to the transistor 53. Thus, the control signal fed to each base of the transistors 53 and 54 is utilized for controlling the base currents of the output transistors 23 and 24.

In operation, when the total sum of each potential difference across the resistors 27 and 28 is made larger than the constant voltage E of the predetermined constant voltage generator 32, the collector current of the transistor 45 is decreased and hence the collector potential is raised toward a positive direction to render the transistors 53 and 55 to be in a more non-conductive, i.e., cut-off region. The operating point of the transistor 54 which is driven by the transistor 55 may also be moved to a more non-conductive region due to the base potential shift of the transistor 54 toward a negative level. As a result, the base potential of the transistor 50 is lowered toward a negative and the base potential of the transistor 51 is raised toward a positive, respectively in proportion to the degree of non-conductiveness of transistors 53 and 54, so that the base potential of the transistor 41 is lowered toward a negative while the base potential of the transistor 43 is raised toward a positive. Thus, the emitter currents of both the transistors 23 and 24 are decreased in proportion to the changes of the base currents of the transistors 41 and 43 so that the compensation for the alterations of the sum of each potential difference developed across the respective resistors 27 and 28 are fully accomplished. On the other hand, when the total sum of each potential difference across the resistors 27 and 28 is made smaller than the constant voltage E of the predetermined constant voltage generator 32, the operation of the amplifier is carried out just in the similar manner as described above, so that each emitter current of the transistors 23 and 24 is increased thereby to compensate for the alterations of the sum of each potential difference developed across the resistors 27 and 28. It should be noted that the above described operation is carried out always in an attempt to retain the initial condition $I_N R_E + I_P R_E = E$, i.e., $I_N + I_P = 2I_D$, so that the sum of the emitter currents of the transistors 23 and 24 is maintained constant.

Figure 6:
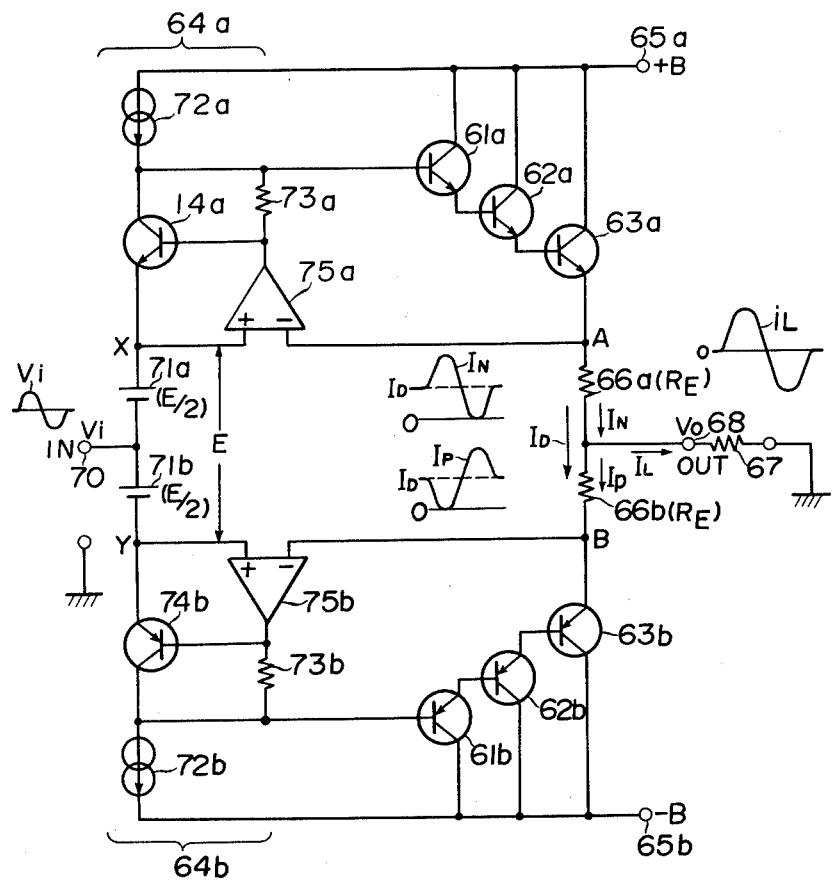
FIG. 6 is a schematic diagram depicted briefly for purposes of illustrating a principle of a second embodiment of a class A complementary push-pull amplifier according to the invention.

Referring now to FIG. 6, there is shown a schematic diagram for purposes of illustration of a class A complementary push-pull amplifier constructed in accordance with the aforementioned principle (b) of the invention.

In the drawing, the amplifier is shown having two parallel amplifier sections, one section including NPN output transistors 61a, 62a and 63a, and the other section including PNP output transistors 61b, 62b and 63b. The transistors 61a, 62a and 63a as well as the transistors 61b, 62b and 63b are jointly connected in a Darlington configuration, and the transistors of both sections are connected each other to form a complementary single-ended push-pull circuit. Thus, the collectors of the transistors 61a, 62a and 63a are connected to a positive power supply terminal 65a, while the collectors of the transistors 61b, 62b and 63b are connected to a negative power supply terminal 65b, and the emitters of the transistors 63a and 63b are connected each other through respective emitter resistors 66a and 66b each having a resistance value of $R_E$. A junction point of these resistors 66a and 66b is connected to an output terminal 68 to which a load 67 of the amplifier is connected. It is to be noted as described later that the emitter resistors 66a and 66b function to detect the respective currents flowing through the transistors 63a and 63b, and the resistors 66a and 66b are respectively employed as a first and a second current detection means. To the amplifier having two parallel amplifier sections thus constructed, there is further provided, for controlling bias currents of the transistors 61a and 61b and hence the transistors 63a and 63b, a bias controlling circuit which is comprised of first and second comparators 75a and 75b, constant voltage generators 71a and 71b, and first and second bias setting circuits 64a and 64b. The comparator 75a having an inverting input terminal, a non-inverting input terminal and an output terminal is connected to the emitter of the transistor 63a at its inverting terminal, which is shown as point A in FIG. 6. The non-inverting terminal of the comparator 75a is also connected to a positive terminal shown as point X in FIG. 6 of the positive terminal of the constant voltage generator 71a generating a constant voltage of E/2, and in turn the negative terminal of the generator 71a is connected to an input terminal 70 to which an input signal to be amplified is applied. Thus, the comparator 75a is so arranged that it compares a potential difference developed across the emitter resistor 66a with the constant voltage E/2 of the constant voltage generator 71a to output a control signal proportional to the voltage difference between them. The control signal is then fed to the first bias setting circuit 64a which comprises a transistor 74a, a resistor 73a and a constant current source 72a. The base of the transistor 74a is connected to the output terminal of the comparator 75a, while the emitter thereof is connected to the point X, and the collector thereof is connected to the positive power supply terminal 65a through the constant current source 72a. The resistor 73a is coupled between the base and the collector of the transistor 74a, the collector of the transistor 74a being connected to the base of the transistor 61a to feed a bias current in proportion to the control signal supplied from the comparator 75a. The above circuit configuration in relation with the first amplifier section or the output transistors 61a, 62a and 63a is also the same for the second amplifier section or the output transistors 61b, 62b and 63b, and therefore the description thereof is omitted for clarity purposes except that the corresponding points A and X are designated here as B and Y, respectively, and other counterparts are designated as attached the suffix "b" instead of "a".

In FIG. 6 the following reference letters are given to explain the operation of the class A complementary push-pull amplifier thus constructed: Vi represents a voltage value of an input signal applied between the input terminal 70 and ground, Vo represents a voltage value obtained at the output terminal 68, E represents a voltage value developed across the points X and Y, $I_N$ and $I_P$ represent current values flowing through the respective resistors 66a and 66b, respectively, $I_D$ represents a value of an idle current flowing through the resistors 66a and 66b, and $I_L$ represents a value of a current flowing through the load 67.

The bias setting circuits 64a and 64b in the amplifier is generally functioning to provide bias voltages and currents of known magnitudes to the complementary transistors 61a to 63a and 61b to 63b for operating them class A, and the input signal applied to the input terminal 70 is fed to the bases of the transistors 61a and 61b through the constant voltage generators 71a and 71b and also through the transistors 74a and 74b thereby being power amplified in the transistors 63a and 63b to deliver the output signal across the load 67 via each emitter resistor 66a and 66b. In addition to the bias setting circuits 64a and 64b, the bias controlling circuit of the amplifier as a whole is functioning to maintain constant the total sum of the currents flowing through each output transistors 63a and 63b, or in other words to make the potential difference between the points A and B equal to that between the points X and Y.

The operation of the amplifier is further explained in more detail with respect to its quiescent and dynamic operation.

First, during quiescent operation when no input signal is applied, i.e., Vi=0 and Va=0, the comparator 75 compares a potential drop $R_E I_N$ at the point A with the constant voltage E/2 at the point X so as to produce a control signal in proportion to the voltage difference between them so that the bias setting circuit 64a is subsequently controlled by the control signal. Thus, if the amplifier is forced into a condition $R_E \cdot I_N > E/2$, the comparator 75a decreases its output current to lower the collector-emitter voltage $V_{CE}$ of the transistor 74a due to a voltage drop across the resistor 73a. Consequently, the base-emitter voltage $V_{BE}$ of the transistors 61a to 63a is lowered to decrease the current $I_N$ flowing through the resistor 66a so that the potential drop $R_E \cdot I_N$ at the point A is restored to the original value. Contrary to the above, if the amplifier is forced into a condition $R_E \cdot I_N < E/2$, the potential drop $R_E \cdot I_N$ at the point A is increased until it reaches at the same potential as the constant voltage E/2 at the point X. This compensation process may be understood from another point of view that the potential at the point A is always retained equal to the potential at the point X by means of a negative feed back of the potential at the point A to the base of the transistor 61a through the comparator 75a and the transistor 74a. The comparator 75b operates in the similar manner as the comparator 75a so that the amplifier is also controlled to maintain the potential at the point B equal to the potential at the point Y. As a result in the amplifier as a whole the potential difference between the points A and B is made equal to the constant voltage E between the points X and Y, and hence it is maintained always constant.

Second, during dynamic operation when an input signal is applied, the potentials at both the input terminal 70 and the output terminal 68 are swinging in accordance with the input signal in the known manner. In this case, however, it should also be noted that the same compensation process as described above is achieved in such a way as the biases to be fed to the transistors 63a and 63b are controlled through the comparators 75a and 75b so as to maintain the potential difference between the points A and B equal to the constant voltage E between the points X and Y.

From the foregoing description, it is to be understood readily that the idle current $I_D$ flowing through the transistors 63a and 63b is expressed as:

$$I_D = E/2R_E \qquad (6)$$

Figure 1:
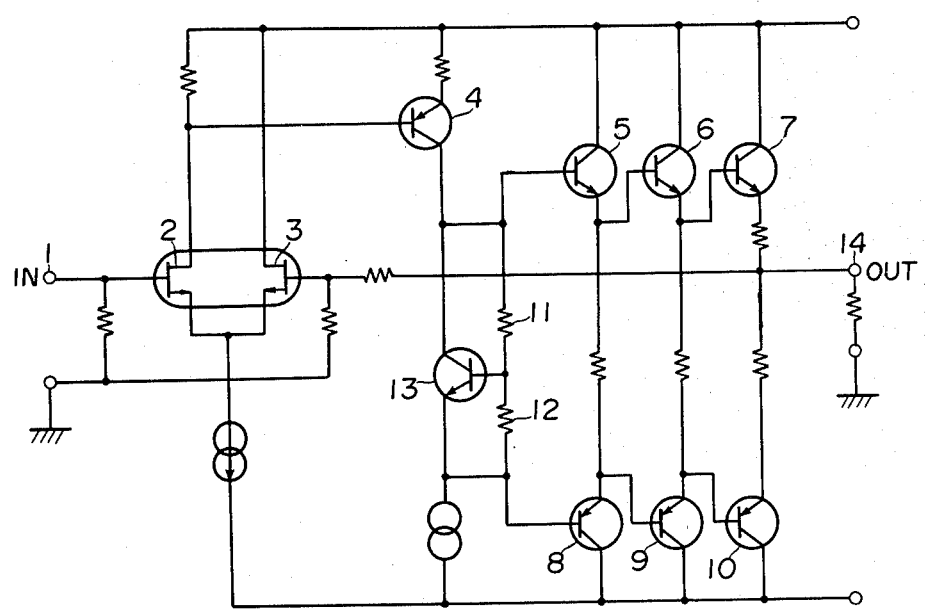
FIG. 1 is a schematic diagram of a conventional class A complementary push-pull amplifier.

Thus, the temperature characteristics of the amplifier is determined only by that of the comparators 75a and 75b, i.e., the input off-set characteristics of the comparators, because the constant voltage $(E/2+E/2=E)$ is readily made independent of temperatures by the well-known tequnique concerned. Therefore, the amplifier having high thermal stability is implemented by simply utilizing a differential amplifier with high thermal stability as those comparators 75a and 75b, without the introduction of a conventional thermal coupling, as shown in FIG. 1, between the output transistors 7 and 10, and the temperature compensating transistor 13.

Further, the foregoing equations (1), (2), (3) and (4) together with (6) are also true in this case, and they are adopted for circuit analysis of FIG. 6 as well as FIG. 4. Thus, the currents $I_N$ and $I_P$ flowing through the respective transistors 63a and 63b vary in proportion to the changes of the output current $I_L$, which is clearly understood from the equztions (3) and (4) where $I_D$ is held constant at a value of $E/2R_E$. For example, if an output current $I_L$ having a similar waveform as an input signal is a sinusoidal wave, the currents $I_N$ and $I_P$ have also the same waveform. As a result, the frequency characteristics of a power source to be used in the amplifier applied to the positive and negative power supply terminal is not required to cover much broader frequency range than that of an input signal or an output signal.

Moreover, since the resistor 66a and the comparator 75a provide negative feedback to the transistors 61a, 62a and 63a, and the resistor 66b and the comparator 75b provide negative feedback to the transistors 61b, 62b and 63b as well, odd harmonics otherwise produced in the transistors 61a to 63a and 61b to 63b are substantially eliminated by the negative feedback effect.

Figure 7:
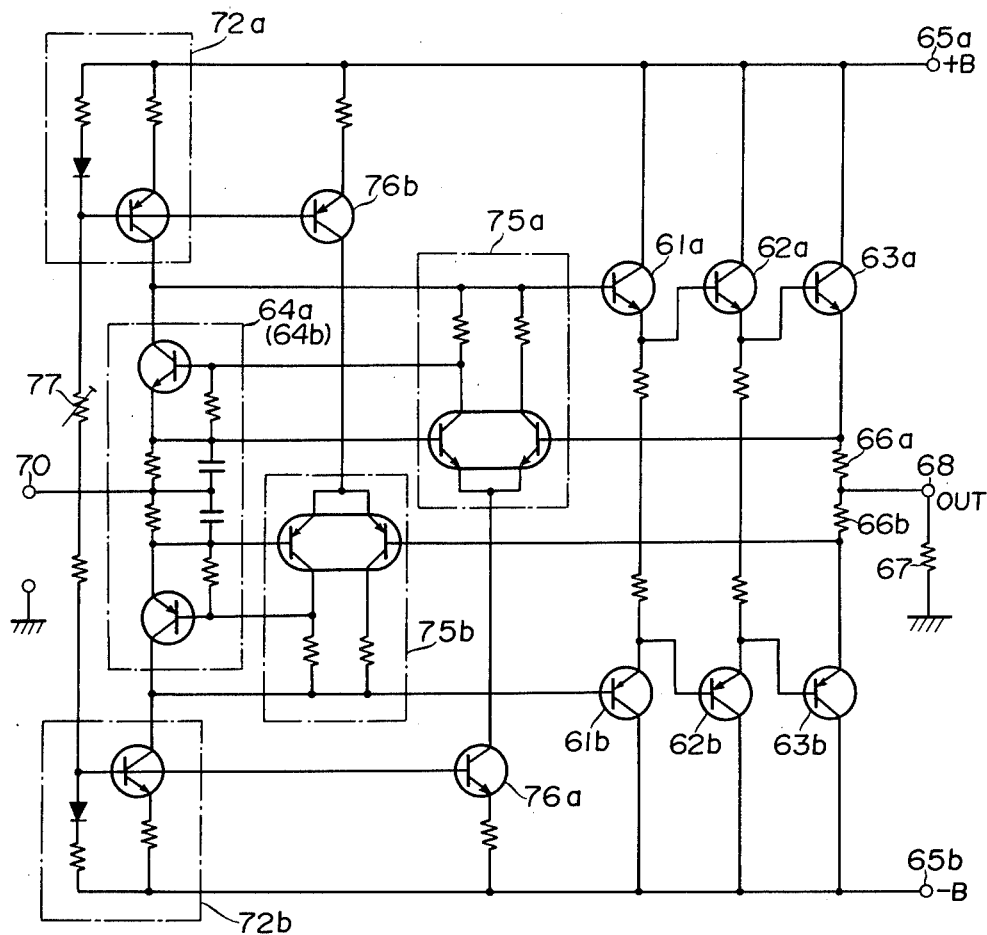
FIG. 7 is a more concrete schematic diagram of the second embodiment of a class A complementary push-pull amplifier according to the invention.

In FIG. 7 an example of a more concrete embodiment of a class A complementary push-pull amplifier is shown. FIG. 7 shows a schematic diagram of an amplifier essentially similar to FIG. 6 wherein similar reference numerals have been used to designate corresponding parts of the amplifier in FIG. 6. Many aspects of the amplifier shown in FIG. 7 operate in a similar manner as their counterparts in FIG. 6 and a detailed description thereof will be omitted for FIG. 7 for purposes of clarity. The differences between FIG. 6 and FIG. 7 are as follows. In FIG. 7 each of comparators 75a and 75b is comprised of a differential amplifier circuit, and the emitters thereof are respectively connected through transistors 76a and 76b to a respective negative and positive power supply terminals 65b and 65a. The transistors 76a and 76b are provided for setting idle currents of the transistors 63a and 63b by adjusting a resistance value of a variable resistor 77.

Figure 8:
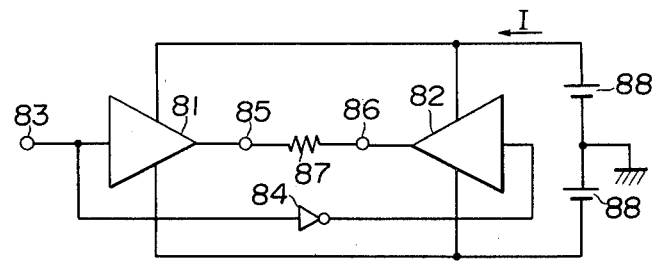
FIG. 8 is a block diagram showing a configuration of a Balanced Transformer Less amplifier employing two class A complementary push-pull amplifiers according to the invention.
Figure 9:
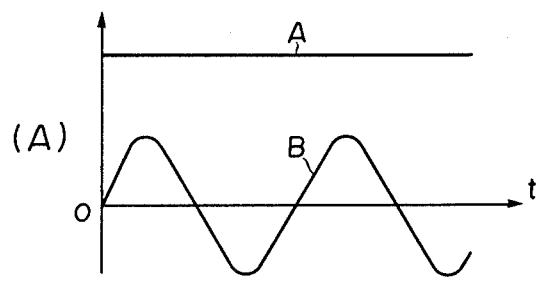
FIG. 9 illustrates a relationship between currents flowing through some portions of a conventional Balanced Transformer Less amplifier and those currents of a Balanced Transformer Less amplifier employing two class A complementary push-pull amplifier according to the present invention.
Figure 9:
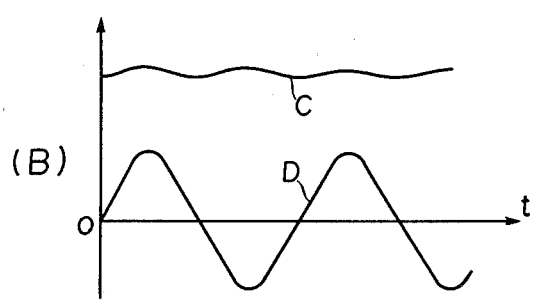

Referring now to FIGS. 8 and 9, one example of the applications utilizing class A complementary push-pull amplifiers in accordance with the present invention is described. FIG. 8 shows a block diagram of a Balanced Transformer Less amplifier in which two class A complementary push-pull amplifiers 81 and 82 constructed in accordance with the invention are used. An input signal applied to an input terminal 83 is fed to an input of the amplifier 81, and also to an input of the amplifier 82 through an inverter 84. The input signal amplified by the amplifiers 81 and 82 are developed across a load 87 which is connected between the output terminals 85 and 86 of the respective amplifiers 81 and 82. In the Balanced Transformer Less amplifier thus constructed, a waveform of a source current I which flows into the class A complementary push-pull amplifiers 81 and 82 is depicted in a substantially straight line A as shown in FIG. 9 (A): this means that the current I is a direct current having no ripple components therein. In FIG. 9 (A), a curve B shows an exemplary waveform of an output voltage developed across the load 87 in case that an input to the terminal 83 has a sinusoidal wave. Contrary to the above, in a Balanced Transformer Less amplifier using two conventional class A complementary push-pull amplifiers and constructed as described in FIG. 8, a waveform of a source current I is not improved and inherently includes therein ripple components arising from current distortion of output transistors of amplifiers. The exemplary waveform of the source current I is shown in FIG. 9 (B) as a curve C, a curve B being a corresponding waveform of output voltage developed across the load 87 in case that an input to the terminal has a sinusoidal wave. It should be understood that the improvement is attained by utilizing class A complementary push-pull amplifiers according to the invention wherein currents flowing through the respective output transistors of the amplifier are made similar in shape to the current flowing through the load, as have already been described. Thus, since the source current I is a direct current with no ripple components, the Balanced Transformer Less amplifier has many advantages as such: (1) a low frequency time constant performed by non-linear elements included in a power supply may not affect the operation of the amplifier and not lower the regulation of the power supply; (2) no interferences are produced to the amplifier itself and to other instruments by a magnetic coupling or the like from a power supply line through which only a substantially direct current is supplied.

As seen from the foregoing description, it should be appreciated that, since the class A push-pull amplifier according to the present invention is made such that the biases to the output transistors for push-pull operation are controlled so as to always maintain constant the sum of each current flowing through the transistors, the amplifier may be operated with high thermal stability and low distortion as well dispensing with the introduction of a conventional, rather troublesome and insufficient, thermal compensation, and moreover each current flowing through the respective output transistors is made similar in shape to an output current, so that, in particular, a Balanced Transformer Less amplifier composed of class A complementary push-pull amplifiers according to the invention may be operated with a direct current power supply causing no ripple components to generate in the source current.

While there have been shown and described some preferred embodiments of the present invention, it is to be understood that the present invention is not limited thereto but may be variously modified and practiced within the scope set forth in the attached claims.

What is claimed is:

1. A class A push-pull amplifier comprising:
   a first input terminal and a second input terminal to which an input signal to be amplified is applied in same phase;
   an output terminal for delivering said input signal amplified to a load;
   first amplification means and second amplification means for push-pull operation, each amplification means having an input point and an output point and including at least one transistor, the input point of said first amplification means being connected to said first input terminal and the input point of said second amplification means being connected to said second input terminal;
   first current detection means and second current detection means for detecting respectively each value of output currents delivered from the output points of said first and second amplification means, each current detection means being connected to each other in series between the output points of said first and second amplification means, and a junction point of said first and second current detection means being connected to said output terminal;

means for detecting a potential difference developed between said first and second current detection means to produce a control signal; and bias setting means for feeding bias currents to the input points of said first and second amplification means in response to said control signal, whereby the sum of each output current delivered from the output points of said first and second amplification means is held constant.

2. A class A push-pull amplifier according to claim 1, wherein said detecting means is comprised of comparator means for detecting a potential difference developed between said first and second current detection means with a predetermined constant voltage supplied from a constant voltage generator means to produce the control signal, said bias setting means being controlled in response to said control signal so as to maintain said potential difference equal to said constant voltage.

3. A class A push-pull amplifier according to claim 2, wherein each of said first and second amplification means comprises a plurality of transistors connected together in a Darlington configuration.

4. A class A push-pull amplifier according to claim 2, wherein each of said first and second current detection means comprises a resistor having a same resistance value relative to one another.

5. A class A push-pull amplifier according to claim 2, wherein said comparator means is a differential amplifier comprising at least two transistors whose inputs are respectively connected to the output point of said first amplification and to the output point of said second amplification means through said constant voltage generator means thereby to produce said control signal.

6. A class A push-pull amplifier according to claim 2, wherein said bias setting means comprises a first pair of transistors complementary in type relative to one another and connected together in series between the input points of said first and second amplification means, and a second pair of transistors complementary in type relative to one another for driving said first pair of transistors inversely in polarity in response to said control signal.

7. A class A push-pull amplifier according to any one of the preceding claims 1–6, wherein said first and second amplification means are complementary in type each other.

8. A class A push-pull amplifier according to claim 1, said detecting means is comprised of;

first comparator means for comparing a first potential difference developed across said first current detection means with a predetermined first constant voltage supplied from a first constant voltage generator means to produce a first control signal;

second comparator means for comparing a second potential difference developed across said second current detection means with a predetermined second constant voltage supplied from a second constant voltage generator means to produce a second control signal, said first and second constant voltages having a reference point connected to said input terminal; and wherein said bias setting means is comprised of first and second bias setting means respectively for feeding a bias current to each input of said first and second amplification means in response to corresponding said first and second control signal so as to maintain each first and second potential difference equal to corresponding said first and second constant voltage.

9. A class A push-pull amplifier according to claim 8, wherein each of said first and second amplification means comprises a plurality of transistors connected together in a Darlington configuration.

10. A class A push-pull amplifier according to claim 8, wherein each of said first and second current detection means comprises a resistor having a same resistance value relative to one another, and further each of said first and second constant voltage has a same value relative to one another.

11. A class A push-pull amplifier according to claim 8, wherein said first comparator means is a differential amplifier comprising at least two transistors whose inputs are respectively connected to the output point of said first amplification means and to said first constant voltage generator means thereby to produce said first control signal, and further said second comparator means is a differential amplifier comprising at least two transistors whose inputs are respectively connected to the output point of said second amplification means and to said second constant voltage generator means thereby to produce said second control signal.

12. A class A push-pull amplifier according to claim 8, wherein said first bias setting means comprises a first transistor to the base of which said first control signal is supplied, the collector of said first transistor being connected to both the input of said first amplification means and a first current source and the emitter of said transistor being connected to said first constant voltage generator means, and said second bias setting means comprises a second transistor complementary in type to said first transistor, said second control signal being supplied to the base of said second transistor whose collector is connected to both the input of said second amplification means and a second current source, the emitter of said second transistor being connected to said second constant voltage generator means.

13. A class A push-pull amplifier according to any one of claims 8–12, wherein said first and second amplification means are complementary in type each other.

* * * * *

UNITED STATES PATENT AND TRADEMARK OFFICE
CERTIFICATE OF CORRECTION

PATENT NO. : 4,356,452
DATED : October 26, 1982
INVENTOR(S) : Masayuki Iwamatu

It is certified that error appears in the above—identified patent and that said Letters Patent is hereby corrected as shown below:

Column 3, line 43, "$I_N+I_P 2ID=constant$" should read

--$I_N + I_P = 2I_D = constant$--.

Column 5, line 6, "$I_N R_E + I_P R_E + E$, i.e. $I_N + I_p + 2I_D$" should read --$I_N R_E + I_P R_E = E$, i.e., $I_N + I_P = 2I_D$--.

*Signed and Sealed this*

*First* Day of *February 1983*

[SEAL]

*Attest:*

GERALD J. MOSSINGHOFF

*Attesting Officer*     *Commissioner of Patents and Trademarks*